United States Patent [19]

Mizushima et al.

[11] Patent Number: 5,051,573
[45] Date of Patent: Sep. 24, 1991

[54] OPTICAL LOGIC OPERATION SYSTEM

[75] Inventors: Yoshihiko Mizushima; Kazutoshi Nakajima; Toru Hirohata; Takashi Iida; Yoshihisa Warashina; Kenichi Sugimoto; Hirofumi Kan, all of Shizuoka, Japan

[73] Assignee: Hamamatsu Photonics Kabushiki kaisha, Shizuoka, Japan

[21] Appl. No.: 435,739

[22] Filed: Nov. 14, 1989

[30] Foreign Application Priority Data

Mar. 29, 1989 [JP] Japan .................................. 77332

[51] Int. Cl.$^5$ .............................................. H01J 31/50
[52] U.S. Cl. .................................. 250/213 A; 377/102
[58] Field of Search ............. 250/211J, 213 A, 213 R, 250/208.1, 213 VT; 307/311; 377/102; 365/108, 109, 112, 215

[56] References Cited

U.S. PATENT DOCUMENTS

| | | | |
|---|---|---|---|
| 3,643,116 | 2/1972 | Culver et al. | 307/311 |
| 4,689,793 | 8/1987 | Liu et al. | 250/213 A |
| 4,716,297 | 12/1987 | Wills et al. | 250/551 |
| 4,905,312 | 2/1990 | Mukozaka | 250/213 VT |
| 4,973,833 | 11/1990 | Takada et al. | 250/208.1 |

OTHER PUBLICATIONS

"Opto-electronic signal processing element", IBM Technical Disclosure Bulletin, vol. 31, No. 9, Feb. 1989, pp. 218-221.

*Primary Examiner*—David C. Nelms
*Assistant Examiner*—S. Allen
*Attorney, Agent, or Firm*—Finnegan, Henderson, Farabow, Garrett, and Dunner

[57] ABSTRACT

A plurality of ultra-high speed light receiving elements are provided each of which has two rectifier junctions being connected to each other opposite in polarity and has a substantially symmetrical electrode arrangement. A bias voltage is applied to each of the light receiving elements from one or a plurality of power sources. Electrical signals produced by the light receiving elements in response to input optical pulse signals are superposed on one another to produce one or a plurality of output electrical signals representing a predetermined logic operation with respect to the input optical pulse signals. Depending on the arrangement of its elements, the optical logic operation system functions as an OR circuit, AND circuit, NOT circuit, EXCLUSIVE OR circuit, or half-adder circuit.

6 Claims, 5 Drawing Sheets

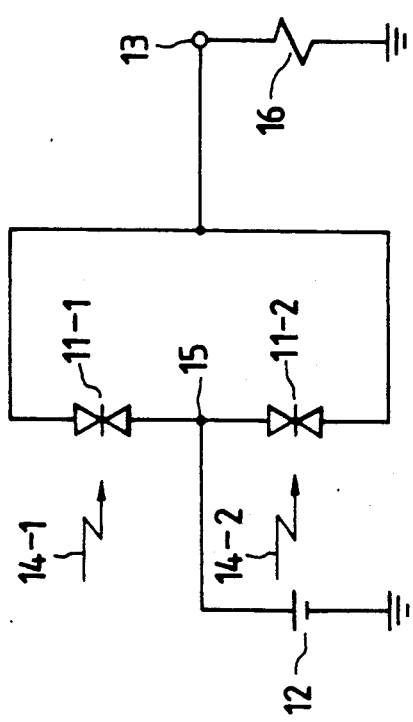

| INPUT OPTICAL PULSE SIGNAL | OUTPUT ELECTRICAL PULSE SIGNAL |
|---|---|
| 24-1 | 23 |
| (0) | ─ (1) |
| ⎍ (1) | ⎎ (0) |

| INPUT OPTICAL PULSE SIGNAL | | OUTPUT ELECTRICAL PULSE SIGNAL |
|---|---|---|
| 34-1 | 34-2 | 33 |
| (0) | (0) | (0) |
| (1) | (0) | (1) |
| (0) | (1) | (1) |
| (1) | (1) | (0) |

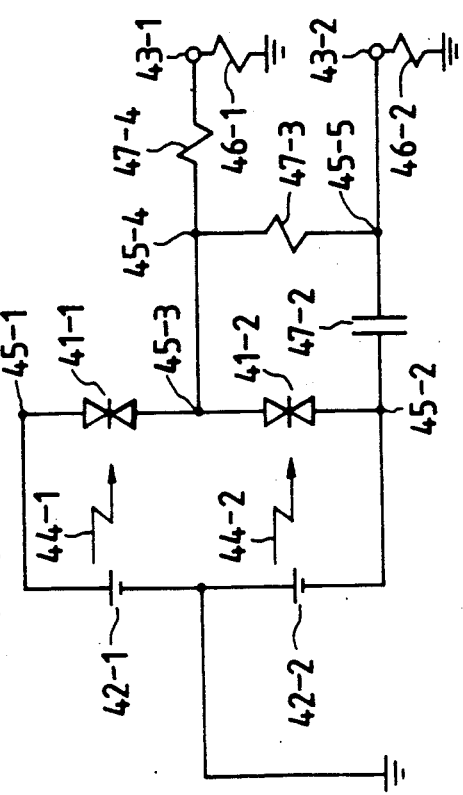
FIG. 4(c)
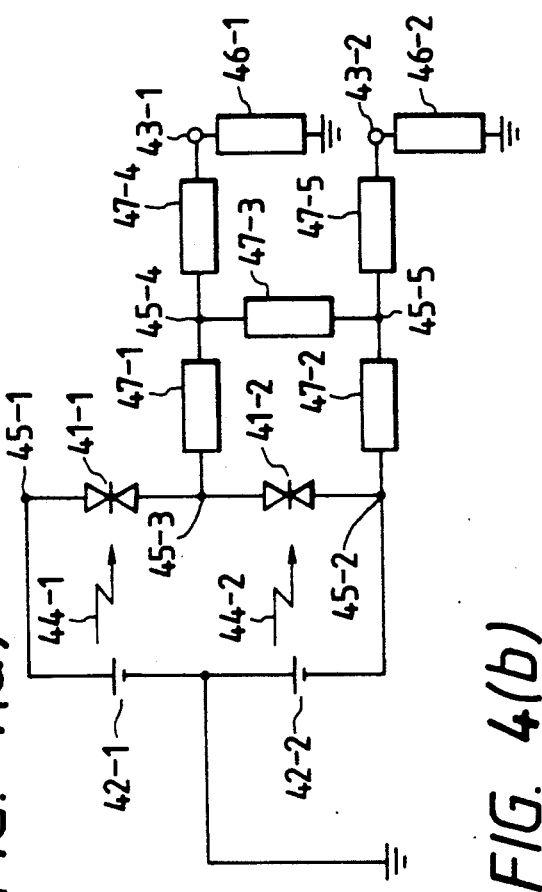
FIG. 4(a)
FIG. 4(b)

OPTICAL LOGIC OPERATION SYSTEM

BACKGROUND OF THE INVENTION

This invention relates to a system for performing logic operations, and more particularly to an optical logic operation system made of a combination of light receiving elements.

A system comprising a few light receiving elements in combination to perform logic operations by themselves has not been proposed in the art. It is true that a system has been proposed in which, as shown in FIG. 7, optical signals 4-$l$ through 4-$n$ are converted by light receiving elements 1-$l$ through 1-$n$ into electrical signals, respectively, which are applied to a conventional logic operation electronic circuit 2, so that a logic operation is performed by using optical signals. However, the system is merely a combination of the light receiving elements and the electronic circuit. In FIG. 7, reference characters 3-$l$ through 3-$n$ designate the output terminals of the electronic circuit.

In the above-described conventional system, the light receiving operation and the logic operation are performed separately, and therefore the system is intricate. One of the reasons why optical signals are used for logic operations is that the high speed characteristics of light can be utilized. However, in the conventional system, this advantage is not sufficiently utilized because the electronic circuit using active elements has a large time constant.

SUMMARY OF THE INVENTION

An object of the present invention is to provide an optical logic operation system which employs the ultra-high speed light receiving elements and has such features that the system is scarcely affected by a time constant of an electronic circuit included and is simple in construction.

In the optical logic operation system according to the invention, a plurality of ultra-high speed light receiving elements are provided each of which has two rectifier junctions being connected to each other opposite in polarity and has a substantially symmetrical electrode arrangement, bias voltages are applied to the light receiving elements, respectively, and the electrical signals produced by the light receiving elements at their terminals in response to optical pulse signals are superposed on one another before outputted. Thus, depending on the arrangement of its elements, the optical logic operation system functions as an OR circuit, AND circuit, NOT circuit, EXCLUSIVE OR circuit, or half-adder circuit.

The optical logic operation system of the invention is based on the fact that by using this type of light receiving element as a signal-input gate, equivalent electrical signals are obtained from both sides of the light receiving elements and positive and negative electrical signals can be equally obtained by changing the polarity of the bias voltage applied to the light receiving element.

Owing to its structure, the light receiving element has an advantage of small dark current; i.e., noises can be suppressed, independently of the polarity of the bias voltage applied to the light receiving element. The light receiving elements having superior high speed characteristics can be fabricated according to a conventional manufacturing method.

According to the invention, logic operations can be performed at extremely high speed, because logic operations are executed in the light receiving elements themselves as the light-input gates in response to input optical signals and therefore there is no need to use active elements of slow time constants, such as transistors. Furthermore, since the light receiving elements of this type can be integrated monolithically on one semiconductor substrate using conventional manufacturing techniques, the integrated optical logic operation system of the invention is given the same advantages as those which would be obtained with conventional electronic integrated circuits made by the similar techniques.

BRIEF DESCRIPTION OF THE DRAWINGS

FIGS. 1($a$) and 1($b$) are diagrams showing a first embodiment of this invention which is an optical logic operation system serving as an AND or OR circuit;

FIGS. 4($a$) to 4($c$) are diagrams showing a fourth embodiment of the invention which is an optical logic operation system operating as a half-adder circuit;

DETAILED DESCRIPTION OF THE PREFERRED EMBODIMENTS

Figures 2A, 2B:
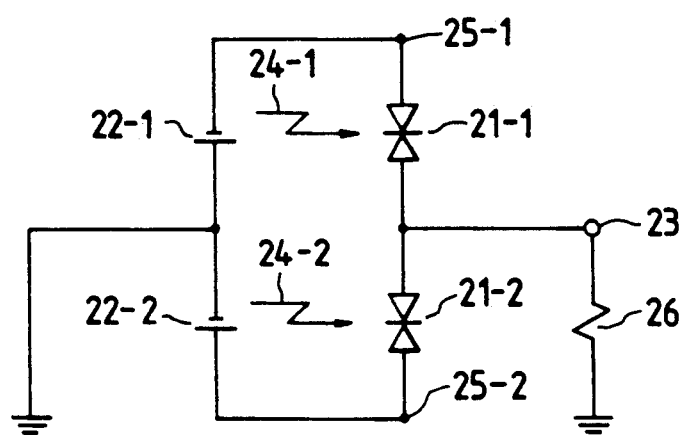
FIGS. 2($a$) and 2($b$) are diagrams showing a second embodiment of the invention which is an optical logic operation system serving as a NOT circuit.

The light receiving element employed in the present invention is of a type described in the paper "Metal-Semiconductor-Metal Photodetector for High-Speed Optoelectronic Circuits", proceedings of the 11th Conference on Solid State Devices (1979), pp 27–29, and in the U.S. patent application Ser. No. 07/363,741. The light receiving element consists of two Schottky electrodes formed on a semiconductor substrate with a small gap therebetween, so that the element has two rectifier junctions connected to each other opposite in polarity and a substantially symmetrical electrode arrangement. The surface area of the semiconductor substrate between the two Schottky electrodes acts as a light receiving surface. This type of light receiving element operates at ultra-high speed.

Various embodiments of the present invention are described hereinafter with reference to the accompanying drawings.

FIGS. 1($a$) and 1($b$) show a first embodiment of this invention. More specifically, FIG. 1($a$) is a circuit diagram showing the arrangement of an optical logic operation system which comprises two light receiving elements of the above type (hereinafter referred to merely as "light receiving element", when applicable) to perform an AND or OR logic operation; and FIG. 1($b$) is a truth table of the system, including the peak values of the output signals thereof.

In FIG. 1($a$), reference characters 11-1 and 11-2 designate the aforementioned light receiving elements; 12, a power source for applying a bias voltage to the light receiving elements; 13, an AND or OR output terminal; 14-1 and 14-2, input optical pulse signals; 15, a terminal of the light receiving elements to which the bias voltage is applied; and 16, a load resistor connected to the output terminal 13. In FIG. 1(b), the parenthesized numerals indicate logic signals, and the one-dot chain lines indicate threshold levels. (Similar notation is used in FIGS. 2(b), 3(b) and 4(c).)

Depending on the manner in which the optical pulse signals 14-1 and 14-2 are applied to the light receiving elements 11-1 and 11-2, three different electrical signals as shown in FIG. 1(b) are produced at the output terminal 13. That is, there are three manners of applying the optical pulse signals: in the first manner, no optical signals are applied to the light receiving elements; in the second manner, an optical pulse signal is applied to only one of the light receiving elements; and in the third manner, optical pulse signals are applied to both the light receiving elements at the same time. In the latter case where optical pulse signals are applied to the light receiving elements simultaneously, the output electrical signal is twice as high in peak value as that produced in the case where an optical pulse signal is applied to only one of the light receiving elements. By providing either one of the threshold levels as indicated by the one-dot chain line in FIG. 1(b), the circuit can be operated as an AND or OR circuit. More specifically, with the threshold level a, the circuit will function as an AND circuit; and with the threshold level b, it will function as an OR circuit. The circuit may have such threshold levels, because it is a digital circuit for logic operations.

FIGS. 2(a) and 2(b) show a second embodiment of the invention. More specifically, FIG. 2(a) is a circuit diagram showing an optical logic operation system which comprises two light receiving elements to perform a NOT logic operation; and FIG. 2(b) is a truth table of the optical logic operation system. In FIG. 2(a), reference characters 21-1 and 21-2 designate the aforementioned light receiving elements; 22-1 and 22-2, power sources for applying bias voltages to the light receiving elements, respectively, 23, an output terminal of the NOT circuit; 24-1, an input optical pulse signal; 24-2, a continuous wave light beam, or a continuous pulse light beam; 25-1 and 25-2, terminals through which the bias voltages are applied to the light receiving elements; and 26, a load resistor connected to the output terminal 23.

The bias voltages opposite in polarity as viewed from the output terminal 23 are applied from the power sources 22-1 and 22-2 to the terminals 25-1 and 25-2 of the light receiving elements 21-1 and 21-2, respectively. As was described above, the continuous wave light beam or continuous pulse light beam 24-2 is applied to the light receiving element 21-2. Therefore, when the optical pulse 24-1 is not applied to the light receiving element 21-1, a logic signal "1" is produced at the output terminal 23. When, under this condition, the optical pulse 24-1 is applied to the light receiving element 21-1, the electrical logic signal at the output terminal 23 becomes "0".

Figures 3A, 3B:
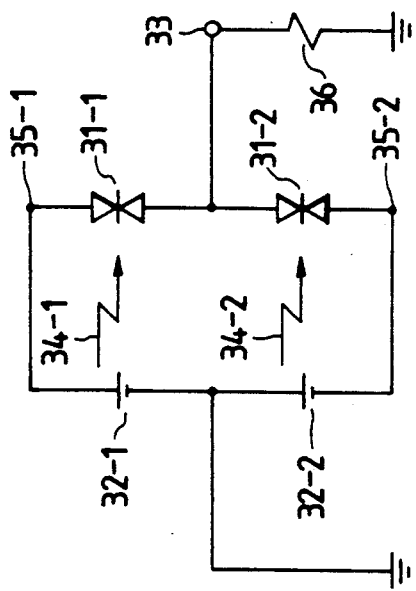
FIGS. 3($a$) and 3($b$) are diagrams showing a third embodiment of the invention which is an optical logic operation system functioning as an EXCLUSIVE OR circuit.

FIGS. 3(a) and 3(b) show a third embodiment of the invention. More specifically, FIG. 3(a) is a circuit diagram showing an optical logic operation system which comprises two light receiving elements to perform an EXCLUSIVE OR (XOR) logic operation; and FIG. 3(b) is a truth table of the optical logic operation system, including the polarity of the output signals thereof.

In FIG. 3(a), reference characters 31-1 and 31-2 designate light receiving elements; 32-1 and 32-2, power sources for applying bias voltages to those light receiving elements; 33, an output terminal of the XOR circuit; 34-1 and 34-2, input optical pulse signals; 35-1 and 35-2, terminals through which the bias voltages are applied to the light receiving elements; and 36, a load resistor connected to the output terminal 33.

The bias voltages opposite in polarity to each other as viewed from the output terminal 33 are applied from the power sources 32-1 and 32-2 to the terminals 35-1 and 35-2 of the light receiving elements 31-1 and 31-2, respectively. When, in the XOR circuit, none of the light receiving elements receive the optical pulse signals, no output electrical signal is produced. When any one of the light receiving elements receives the optical pulse signal, a logic signal "1" is produced at the output terminal 33, the polarity of which depends on the light receiving element which receiv ·d the optical pulse signal. In the embodiment, when the optical pulse signal 34-1 is applied to the light receiving element 31-1, the electrical signal positive in polarity is produced at the output terminal 33; and when the optical pulse 34-2 is applied to the light receiving element 31-2, the electrical signal negative in polarity is provided at the output terminal 33. When the optical pulses are applied to the light receiving elements at the same time, the electrical signals opposite in polarity cancel out each other, as a result of which a logic signal "0" is produced at the output terminal 33.

FIGS. 4(a) to 4(c) show a fourth embodiment of the invention. More specifically, FIG. 4(a) is a circuit diagram showing an optical logic operation system which performs a half-adder logic operation using two light receiving elements; FIG. 4(b) is a circuit diagram showing one concrete example of the optical logic operation system shown in FIG. 4(a); and FIG. 4(c) is a truth table of the system, including the polarity and peak value of the output signals thereof.

In FIG. 4(a), reference characters 41-1 and 41-2 designate light receiving elements; 42-1 and 42-2, power sources for applying bias voltages to those light receiving elements; 43-1 and 43-2, a SUM output terminal and a CARRY output terminal, respectively; 44-1 and 44-2, input optical pulse signals; 45-1 and 45-2, terminals through which the bias voltages are applied to the light receiving elements, respectively; 45-3 through 45-5, terminals; 46-1 and 46-2, load impedances connected to the output terminals 43-1 and 43-2, respectively; and 47-1 through 47-5, circuit elements comprising only passive elements such as resistors and capacitors which are provided for adjusting impedance of the circuit and level of the output signals when necessary. In FIG. 4(b), reference characters 46-1 and 46-2 designate load resistors connected to the output terminals; 47-2, a capacitor; and 47-3 and 47-4, resistors.

The bias voltages which are opposite in polarity to each other as viewed from the connecting terminal 45-3 of the light receiving elements 41-1 and 41-2 are applied from the power supplies 42-1 and 42-2 to the terminals 45-1 and 45-2 of the light receiving elements 41-1 and 41-2, respectively. The circuit elements 47-1 through 47-5 are exemplified in FIG. 4(b).

When none of the light receiving elements receive the optical pulse signals, no electric signal is outputted. When only the light receiving element 41-1 receives the optical pulse signal 44-1, an electrical signal positive in polarity is produced at the SUM output terminal 43-1, and at the same time it is supplied to the CARRY output terminal 43-2 through the terminals 45-4 and 45-5. By setting threshold levels as indicated by the one-dot chain lines in FIG. 4(c), the output logic signal at the SUM output terminal becomes "1", and the output logic signal at the CARRY output terminal becomes "0".

When only the light receiving element 41-2 receives the optical pulse signal 44-2, an electrical signal negative in polarity is produced at the SUM output terminal 43-1, and at the same time an electric signal positive in polarity is supplied to the CARRY output terminal 43-2. By setting threshold levels as indicated in FIG. 4(c), the electrical signal at the SUM output terminal becomes "1" and the electrical signal at the CARRY output terminal becomes "0".

When the two light receiving elements receive the optical pulse signals at the same time, the electrical signals opposite in polarity cancel out each other, as a result of which the output signal at the SUM output terminal becomes "0", and the output signal at the CARRY output terminal is raised beyond the threshold level to "1" because the signals positive in polarity are superposed to increase the peak value. Circuit constants of the elements added to the optical logic operation system should be determined with the light receiving elements 41-1 and 41-2 and impedances of the loads 46-1 and 46-2 taken into account so that the electrical signals generated by the light receiving elements result in the well-balanced output signals through the logic operation and that the deterioration of the circuit time constant is minimized.

While several examples of the optical logic operation systems according to the invention have been described, it should be noted that all optical logic operation systems using a plurality of light receiving elements each of which has the two rectifier junctions being connected opposite in polarity and has the electrodes arranged symmetrically fall within the scope of the invention.

Figure 5:
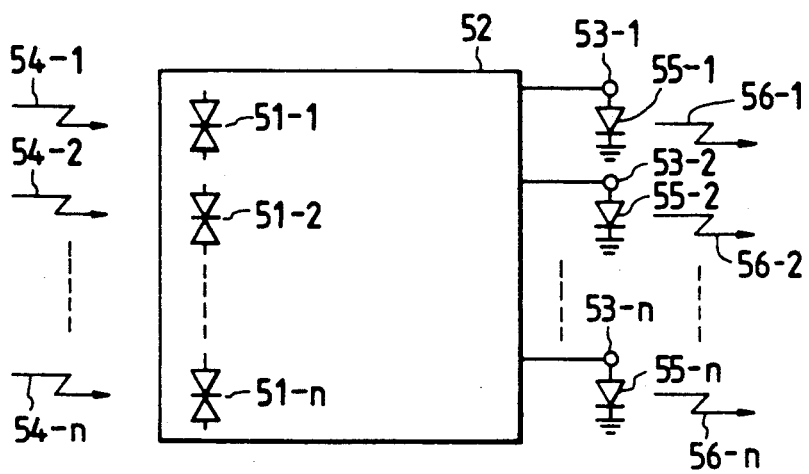
FIG. 5 is a diagram showing a fifth embodiment of the invention which is an optical logic operation system outputting optical pulse signals.

The outputs of the above-described logic operation systems can be produced as optical pulse signals by connecting light emitting elements such as LEDs and semiconductor lasers to the output terminals. FIG. 5 shows a fifth embodiment of the invention, i.e., an optical logic operation system such as those described above which is so designed as to produce the output signals in the form of an optical pulse. In FIG. 5, reference characters 51-*l* through 51-*n* designates light receiving elements; 52, an optical logic operation circuit including the light receiving elements, the circuit 52 having amplifier circuits on the side of output terminals, when necessary; 53-*l* through 53-*n*, the electrical signal output terminals; 54-*l* through 54-*n*, input optical pulse signals; 55-*l* through 55-*n*, light emitting elements such as LEDs and semiconductor lasers connected to the output terminals, respectively; and 56-*l* through 56-*n*, output optical pulse signals. If the electrical signals at the output terminals 53-*l* through 53-*n* are not high enough to drive the light emitting elements 55-*l* through 55-*n*, it is necessary to provide the aforementioned amplifier circuits. In this case, it is desirable that the amplifier circuits are as small in time constant as possible so that the amplifier circuits thus provided may not greatly decrease the operating speed of the system.

Figure 6:
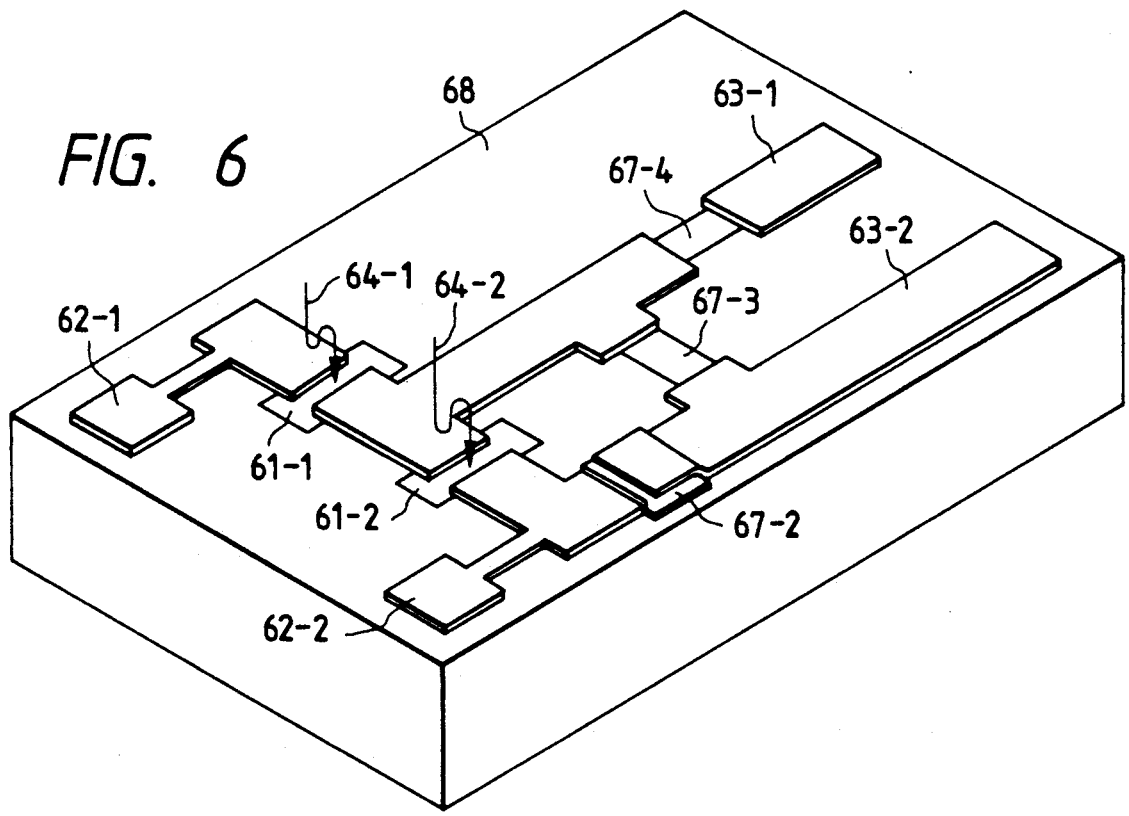
FIG. 6 is a perspective view showing a concrete example of the half-adder circuit shown in FIG. 4.
Figure 7:
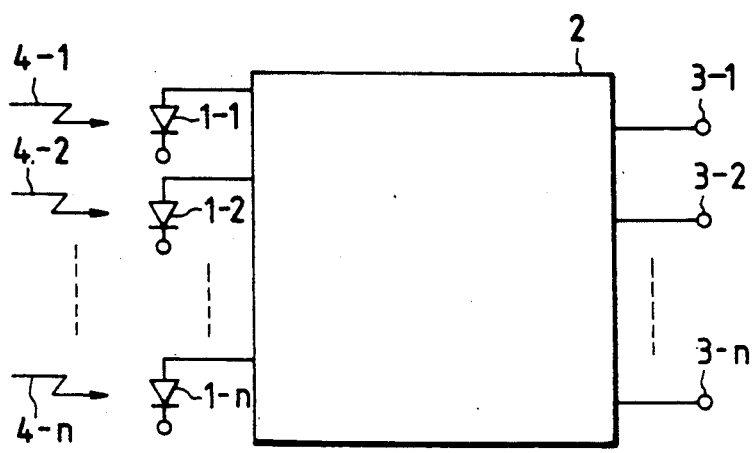
FIG. 7 is a block diagram showing a conventional logic operation system receiving optical input signals.

FIG. 6 shows a concrete example of the half-adder optical logic operation circuit shown in FIG. 4(b) in which the components except the power sources 42-1 and 42-2 and the load resistors 46-1 and 46-2 are monolithically integrated on one semiconductor substrate. In FIG. 6, reference characters 61-1 and 61-2 designate light receiving elements; 62-1 and 62-2, bonding pads for applying the bias voltages to the light receiving elements; 63-1 and 63-2, bonding pads as the sum output terminal and the carry output terminal, respectively, to be connected to the loads; 64-1 and 64-2, input optical pulse signals; 67-2, a capacitor; 67-3 and 67-4, resistors; and 68, a semiconductor substrate.

As was described above, the conventional logic operation circuits use several tens of active elements, i.e., transistors, thus requiring a long delay time in operation. On the other hand, the optical logic operation system of the invention is made up of the light receiving elements and auxiliary passive elements instead of transistors. As was described before, the light receiving elements in the invention can be manufactured so that they operate at considerable high speed. Therefore the optical logic operation system according to the invention operates fully utilizing the high speed characteristic of optical signals.

The circuit elements of the system can be monolithically integrated on one semiconductor substrate. As a result, the circuit and according the system can be reduced in geometry. In addition, the amount of delay due to wiring is reduced, and it follows that the high speed characteristic is greatly improved.

That is, the optical logic operation system according to the invention may be used as one of the means for maximumly utilizing the high speed characteristic of light in the optical wiring which is required to increase the operation speed of computers.

What is claimed is:

1. An optical logic operation system comprising:
two light receiving elements connected at a first output-side connection point, said two light receiving elements being responsive to respective two input optical pulse signals for producing two respective electrical signals, each of said two light receiving elements comprising two Schottky electrodes formed on a semiconductor substrate with a predetermined gap therebetween and with a substantially symmetrical arrangement;
two power sources for providing bias voltages of opposite polarity to said two light receiving elements at terminals opposite to said first output-side connection point;
a SUM output terminal connected to said first output-side connection point and a CARRY output terminal connected to said first output-side connection point;
a passive circuit connected to said CARRY output terminal, said passive circuit comprising resistors and capacitors; wherein
a SUM output signal and CARRY output signal appear at said SUM output terminal and CARRY output terminal, respectively, each of said SUM output signal and carry output signal comprising a superposition of said two electrical signals and representing a half-adder operation with respect to said two input optical pulse signals.

2. An optical logic operation system as claimed in claim 1, wherein said passive circuit is connected in parallel with one of said two light receiving elements, and includes a second output-side connection terminal which is connected to said CARRY output terminal.

3. An optical logic operation system as claimed in claim 1, further comprising two light emitting elements connected to said SUM and CARRY output terminals, respectively, for emitting output optical signals in response to said SUM and CARRY output signals, respectively.

4. An optical logic operation system as claimed in claim 3, wherein said two light receiving elements and said two light emitting elements are integrated on one semiconductor substrate.

5. An optical logic operation system as claimed in claim 1, wherein said two light receiving elements are integrated on one semiconductor substrate.

6. An optical logic operation system as claimed in claim 5 wherein said passive circuit is further integrated on said one semiconductor substrate.

* * * * *

UNITED STATES PATENT AND TRADEMARK OFFICE
CERTIFICATE OF CORRECTION

PATENT NO. : 5,051,573

DATED : September 24, 1991

INVENTOR(S) : Yoshihiko Mizushima et al.

It is certified that error appears in the above-identified patent and that said Letters Patent is hereby corrected as shown below:

Title Page, Assignee, change "kaisha" to --Kaisha--.

Claim 6, column 8, line 5, after "claim 5" insert --,--.

Signed and Sealed this

Fourth Day of May, 1993

Attest:

MICHAEL K. KIRK

Attesting Officer

Acting Commissioner of Patents and Trademarks